(12) United States Patent
Khalil et al.

(10) Patent No.: US 8,680,536 B2
(45) Date of Patent: Mar. 25, 2014

(54) NON-UNIFORM TWO DIMENSIONAL ELECTRON GAS PROFILE IN III-NITRIDE HEMT DEVICES

(75) Inventors: Sameh G. Khalil, Calabasas, CA (US); Karim S. Boutros, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/479,018

(22) Filed: May 23, 2012

(65) Prior Publication Data

US 2013/0313560 A1 Nov. 28, 2013

(51) Int. Cl.
*H01L 29/20* (2006.01)

(52) U.S. Cl.
USPC .......................................................... 257/76

(58) Field of Classification Search
USPC ............... 257/76, 213, 194, E29.249, 92, 192
See application file for complete search history.

(56) References Cited

U.S. PATENT DOCUMENTS

| | | | | |
|---|---|---|---|---|
| 4,800,172 | A * | 1/1989 | Okano et al. | 438/195 |
| 5,309,007 | A * | 5/1994 | Kelner et al. | 257/286 |
| 7,038,299 | B2 | 5/2006 | Furukawa | |
| 7,083,253 | B2 * | 8/2006 | Kimura et al. | 347/29 |
| 7,859,014 | B2 | 12/2010 | Nakayama | |
| 8,076,685 | B2 | 12/2011 | Tamura | |
| 8,124,505 | B1 | 2/2012 | Burnham | |
| 2005/0023555 | A1 | 2/2005 | Yoshida | |
| 2006/0220065 | A1 | 10/2006 | Kawasaki | |
| 2007/0158692 | A1 * | 7/2007 | Nakayama et al. | 257/213 |
| 2008/0157121 | A1 * | 7/2008 | Ohki | 257/194 |
| 2009/0008677 | A1 * | 1/2009 | Kikkawa | 257/194 |
| 2009/0072272 | A1 | 3/2009 | Suh | |
| 2010/0140663 | A1 | 6/2010 | Hopper | |
| 2010/0219452 | A1 | 9/2010 | Brierley | |
| 2011/0031532 | A1 | 2/2011 | Kikkawa | |
| 2011/0049526 | A1 | 3/2011 | Chu | |
| 2011/0057257 | A1 | 3/2011 | Park | |
| 2011/0127541 | A1 | 6/2011 | Wu | |
| 2011/0303952 | A1 | 12/2011 | Hwang | |
| 2012/0098599 | A1 | 4/2012 | Chang | |

FOREIGN PATENT DOCUMENTS

KR 10-2011-0026798 A 3/2011
KR 10-2011-0136719 A 12/2011

OTHER PUBLICATIONS

Smorchkova, I. P. et al., "Polarization-induced charge and electron mobility in AlGaN/GaN heterostructures grown by plasma-assisted molecular epitaxy," Journal of Applied Physics, vol. 86, Issue 8, pp. 4520-4526, Oct. 1999.
U.S. Appl. No. 13/478,609, filed May 23, 2012, Khalil, et al.
U.S. Appl. No. 13/478,402, filed May 23, 2012, Khalil, et al.

(Continued)

*Primary Examiner* — Nathan Ha
(74) *Attorney, Agent, or Firm* — Ladas & Parry

(57) ABSTRACT

A HEMT device has a substrate; a buffer layer disposed above the substrate; a carrier supplying layer disposed above the buffer layer; a gate element penetrating the carrier supplying layer; and a drain element disposed on the carrier supplying layer. The carrier supplying layer has a non-uniform thickness between the gate element and the drain element, the carrier supplying layer having a relatively greater thickness adjacent the drain element and a relatively thinner thickness adjacent the gate element. A non-uniform two-dimensional electron gas conduction channel is formed in the carrier supplying layer, the two-dimensional electron gas conduction channel having a non-uniform profile between the gate and drain elements.

15 Claims, 4 Drawing Sheets

(56) References Cited

OTHER PUBLICATIONS

H. Xing, "High Breakdown Voltage AlGaN/GaN HEMTs achieved by Multiple Field Plates", IEEE Electron Device Letters, vol. 25, No. 4, Apr. 2004.

C.M. Waits, et al., "Gray-Scale Lithography for MEMS Applications", University of Maryland, Department of Electrical Computer Engineering, Institute for Advanced Computer Studies, College Park, Maryland, U.S. 2006.

W. Henke, et al. "Simulation and experimental study of gray-tone lithography for the fabrication of arbitrarily shaped surfaces" Proc. IEEE Micro Electro Mechanical Syst. MEMS 1994, Oiso, Japan, pp. 205-210.

C.M. Waits, et al. "MEMS-based Gray-Scale Lithography" International Semiconductor Device Research Symposium (ISDRS), Dec. 5-7, 2001, Washington D.C.

PCT Search Report and Written Opinion mailed on Aug. 26, 2013 from PCT/US2013/040447 (9 pages).

From U.S. Appl. No. 13/478,402 (unpublished), Application and Office Actions mailed on May 23, 2013 and Aug. 15, 2013.

From U.S. Appl. No. 13/478,609 (unpublished), Application.

Song et al, "Normally Off AlGaN/GaN Low-Density Drain HEMT (LDD-HEMT) With Enhanced Breakdown Voltage and Reduced Current Collapse", IEEE Electron Device Letters, vol. 28, No. 3, Mar. 2007.

PCT International Search Report and Written Opinion mailed on Sep. 30, 2013 for related PCT Application No. PCT/US2013/040431 (9 pages).

PCT International Search Report and Written Opinion mailed on Sep. 27, 2013 for related PCT Application No. PCT/US2013/040441 (10 pages).

From U.S. Appl. No. 13/478,402 (unpublished), Application and Office Actions, including but not limited to the Office Actions mailed on May 23, 2013 and Aug. 15, 2013.

From U.S. Appl. No. 13/478,609 (unpublished), Application and Office Actions.

* cited by examiner

NON-UNIFORM TWO DIMENSIONAL ELECTRON GAS PROFILE IN III-NITRIDE HEMT DEVICES

CROSS REFERENCE TO RELATED APPLICATIONS

This application is related to U.S. patent application Ser. No. 13/478,402 filed on May 23, 2012 and entitled "A Non-Uniform Lateral Profile Of Two-Dimensional Electron Gas Charge Density In Type Iii Nitride Hemt Devices Using Ion Implantation Through Gray Scale MasK and to U.S. patent application Ser. No. 13/478,609 filed on May 23, 2012 and entitled "HEMT GaN Device with on Uniform Lateral Two-Dimensional Electron Gas Profile and Process for Manufacturing the Same".

TECHNICAL FIELD

This invention relates to III-Nitride HEMT devices having a non-uniform Two-Dimensional Electron Gas (2DEG) profile in the carrier supplying layer thereof.

BACKGROUND

III-Nitride High Electron Mobility Transistor (HEMT) devices are often used in power applications and/or high temperature applications in RF circuits and in other applications, including in power supplies for electrically powered motor vehicles.

A design trade-off between the on-state resistance ($R_{on}$) and breakdown voltage (BV) of a HEMT can be improved significantly by following the teachings contained herein. Since the relation between the BV and $R_{on}$ is at least quadratic, improvement in the BV for a given drift region length results in a significant improvement in the figure of merit (FOM) of the device, defined as $BV^2/R_{on}$.

HEMTs utilize two semiconductor materials with different band-gaps, forming an electron potential well at a heterointerface between the two semiconductor materials, which materials might be, for example, AlGaN and GaN. The potential well confines electrons and defines a two-dimensional electron gas (2DEG) conduction channel. Due to the two-dimensional nature of the electrons in the conduction channel, the carrier mobility is enhanced.

Prior art III-Nitride HEMTs utilize a uniform 2DEG density which results in a peak electric field under or near the gate region. The electric field distribution tends to be closer to a triangular shape than to a more desirable trapezoidal shape which reduces the BV per unit drift region length of the device. The use of a field plate and/or multi step field plates are some of the techniques that are used in the prior art to improve the electric field distribution but these techniques typically result in multiple peaks and suffer from less than ideal flat field distribution (they can exhibit a saw tooth type profile) which also adds to the gate to drain capacitance. In addition, process complexity and cost typically increase with the number of field plate steps (levels) utilized.

The prior art includes:

Furukawa, U.S. Pat. No. 7,038,253 issued on May 2, 2006 discloses a GaN based device that represents state of the art GaN on Si technology which uses a uniform 2DEG profile in the drift region. In the absence of any field shaping technique it is expected that the breakdown and dynamic Rdson performance of the device of this patent will be limited by a localized increase in the electric field under the gate region thus requiring over design of the device which degrades the Figure of Merit (FOM) that can be achieved by such a structure.

H. Xing et al. have proposed a device structure that was published in a paper entitled "High Breakdown Voltage AlGaN/GaN HEMTs achieved by Multiple Field Plates", (see H. Xing, Y. Dora, A. Chini, S. Hikman, S. Keller and U. K. Mishra, "High Breakdown Voltage AlGaN—GaN HEMTs Achieved by Multiple Field Plates," IEEE Electron Device Letters, IEEE ELECTRON DEVICE LETTERS, VOL. 25, NO. 4, pp. 161-163, April 2004), which utilizes a field shaping technique that used multiple field plates to improve the electric field distribution, however, this technique is less favorable than the technology disclosed herein since multiple field plates will not achieve a uniform electric field (will have a saw tooth type distribution) and will increase the gate to drain capacitance. In implementing such structure increases device complexity and cost.

C. M. Waits, R. Ghodssi, and M. Dubey, "Gray-Scale Lithography for MEMS Applications", University of Maryland, Department of Electrical and Computer Engineering, Institute for Advanced Computer Studies, College Park, Md., USA, 2006.

W. Henke, W. Hoppe, H. J. Quenzer, P. Staudt-Fischbach and B. Wagner, "Simulation and experimental study of gray-tone lithography for the fabrication of arbitrarily shaped surfaces," Proc. IEEE Micro Electro Mechanical Syst. MEMS 1994, Oiso, Japan, pp. 205-210.

C. M. Waits, R. Ghodssi, M. H. Ervin, M. Dubey, "MEMS-based Gray-Scale Lithography," International Semiconductor Device Research Symposium (ISDRS), Dec. 5-7, 2001, Washington D.C.

In another aspect the present invention relates to a HEMT device comprising: a substrate; a buffer layer disposed above said substrate; a carrier supplying layer disposed above said buffer layer; a gate element penetrating said carrier supplying layer; a drain element disposed on said carrier supplying layer; wherein the carrier supplying layer has a non-uniform thickness between said gate element and said drain element, the carrier supplying layer having a relatively greater thickness adjacent the drain element and a relatively thinner thickness adjacent the gate element.

In yet another aspect the present invention relates to a HEMT device having a non-uniform two-dimensional electron gas conduction channel formed in a carrier supplying layer of the HEMT device between a gate element of the HEMT device and a drain element of the HEMT device, the HMET device also having a constant electric field distribution between said gate element and said drain element.

In still yet another aspect the present invention relates to a HEMT device comprising: a substrate; a buffer layer disposed above said substrate; a carrier supplying layer disposed above said buffer layer; a gate; a drain disposed on said carrier supplying layer; wherein a two dimensional electron gas (2DEG) is formed between the gate and the drain and wherein the carrier supply layer is configured to adapt the 2DEG such that a variation in electric field strength as a function of a distance between the gate and the drain is substantially constant.

BRIEF DESCRIPTION OF THE INVENTION

The invention is concerned with a device structure and a method of implementing a non-uniform two dimensional electron gas profile between the gate and drain electrodes. By implementing a tapered AlGaN layer (charge supplying layer) from the gate to the drain, one can obtain a monotonically increasing 2DEG profile that results in a uniform electric field distribution hence maximizing the FOM of the device.

DETAILED DESCRIPTION

Figure 1A:
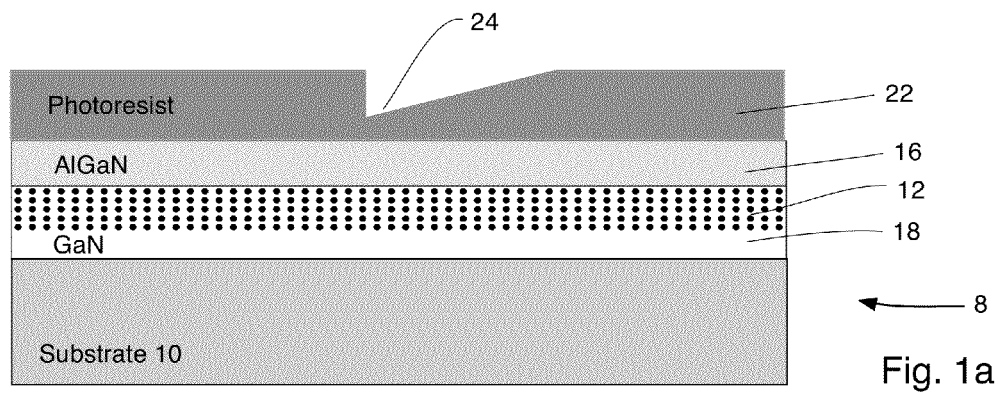
FIG. 1a is a schematic presentation of charge density before tapering the carrier supplying layer (preferably AlGaN), hence the uniform 2DEG density (depth is not drawn to scale) of a partially formed HMET device.

As depicted by FIGS. 1a, 1b, 1c and 2, and in order to improve the electric field distribution along the drift region 26 (the region between the gate 30 and the drain 34) and hence improve the breakdown voltage capability per unit drift region length of a HMET device 8, a non-uniform lateral 2DEG profile 12 along the drift region in layer 18 is provided, in one preferred embodiment, by monotonically tapering the profile (thickness or z-direction) of a carrier supplying layer 16 alone the x-direction between the gate 30 and drain 34. The taper is identified by numeral 14 in FIGS. 1b and 1c. The carrier supplying layer 16 may be, for example, AlGaN (but not limited to) in an AlGaN/GaN HEMT. Monotonically tapering the profile (thickness) of the carrier supplying layer 16 effectively creates a non-uniform profile of two dimensional electron gas (2DEG) 12 where the 2 DEG density increases with the increasing thickness of carrier supplying layer 16.

FIG. 1a shows HMET device 8 in the process of being fabricated. The gate, source and drain electrodes of the device 8 have not yet been formed. The device 8 in the process of being fabricated is comprised in this figure of a stack of III-V layers, preferably grown on a substrate 10. Substrate 10 may be any of the suitable substrates that are commonly used to grow III-Nitride materials, for example Si, Sapphire, SiC, bulk single crystal GaN, and others. As can be seen in FIG. 1a, substrate 10 provides a supporting surface for a layer 18 of GaN material in one embodiment (but other materials such as AlGaN may be used instead for layer 18) or a superlattice formed of alternating layers (e.g. alternating AlGaN/GaN or alternating AlN/GaN) may be used instead for layer 18 or a combination of C-doped GaN buffer and AlGaN back barrier may be used instead for layer 18 or any combination of the aforementioned in still other embodiments may prove to be suitable for layer 18, which layer functions as a buffer layer in HMET device 8.

A carrier supplying layer 16 is preferably formed of AlGaN material and preferably with a suitable Al mole fraction that typically ranges between 20 to 30%, and is grown or otherwise formed on buffer layer 18. FIG. 1a also shows a layer of photoresist 22 disposed on the carrier supplying layer 16, which layer 22 has been photolithographically processed, preferably by gray scale lithography, to allow a triangularly shaped wedge (when viewed in cross section) portion 24 to be etched away from the photoresist layer 22. The layer of photoresist 22 and its triangularly shaped wedge portion 24 is then removed during a subsequent RIE etch process which transfers the wedge pattern 24 from the photoresist 22 and into the carrier supplying layer 16 to thereby define taper 14 therein (see FIGS. 1b and/or 1c). The process is preferably optimized so that photoresist 22 remains in the area where the carrier supplying layer 16 layer is preferably kept intact outside the taper area 14 so that its thickness is preferably not decreased outside of the taper or wedge region 14 by the aforementioned RIE etch. Any remaining photoresist 22 may thereafter be removed with a suitable chemical etchant.

The thicker the carrier supplying layer 16 in a given position in the x-direction along the drift region 26 (see FIG. 2) where x is the horizontal direction from the edge of gate 30 (facing the drain, where x=0) towards the drain 34 (where x=LD at the edge of drain 34 facing the gate 30). The taper 14 in carrier supplying layer 16 (see FIGS. 1b and/or 1c) is preferably produced by gray scale photolithography of the photoresist layer 22 (to remove the photoresist wedge portion 24 therefrom) as mentioned above. This process is followed by the aforementioned controlled RIE where initially the remaining photoresist 22 is removed in the area of the wedge pattern 24 and eventually is completely removed either as the RIE process progresses or by the chemical etch mentioned above. The carrier supplying layer 16 under the thinner part of the wedge pattern 24 experiences a longer RIE etch time than carrier supplying layer 16 under a thicker part of the wedge pattern 24, resulting in a profile transfer from the photoresist wedge pattern 24 to the carrier supplying layer 16. The carrier supplying layer's thickness is preferably uniform in a lateral direction along the lateral extents of the gate or drain regions (along the y-direction of FIG. 1c).

Figure 1B:
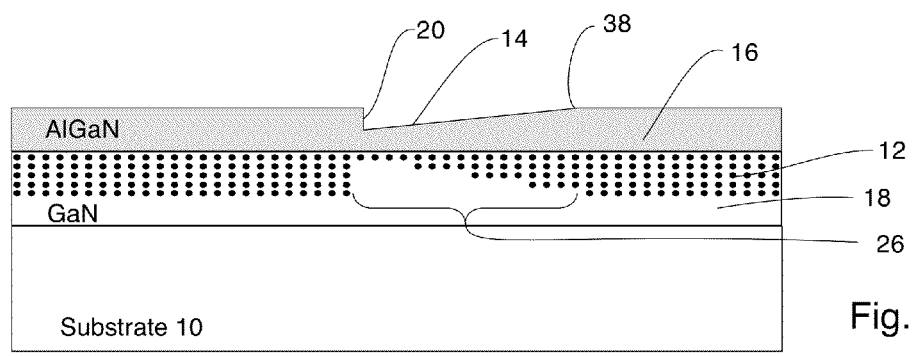
FIG. 1b is a schematic presentation of charge density after tapering the carrier supplying layer (preferably AlGaN) hence the non-uniform 2DEG density (depth is not drawn to scale) of the partially formed HMET device of FIG. 1a after the AlGaN layer has been tapered.
Figure 1C:
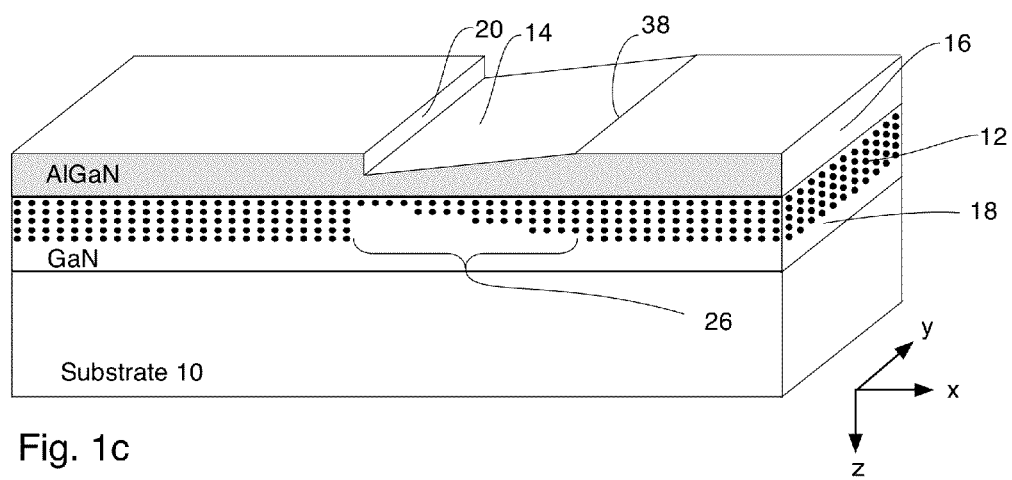
FIG. 1c is similar to FIG. 1b, but depicts the partially formed HMET device of FIG. 1b in a perspective view as opposed to an elevational view thereof.
Figure 3:
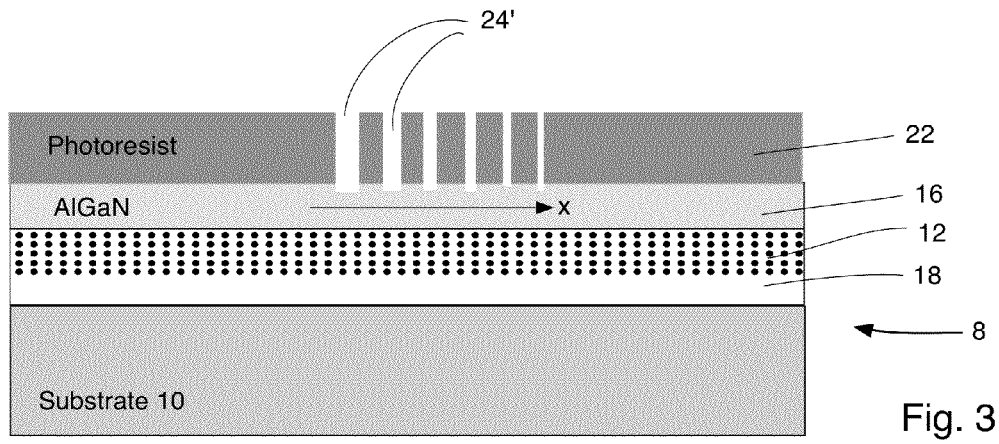
FIG. 3 depicts are alternative method of creating a taper in the carrier supplying layer (preferably AlGaN)

An alternative method for forming such a tapered pattern or wedge 14 in the carrier supplying layer 16 is shown in FIG. 3. This alternative method involves opening windows 24' in the photoresist layer 22 with varying sizes where the size of the opening is a function of the lateral distance from where the gate will be formed to where the drain will be formed (the pattern is similar to that typically used in Gray scale lithography). Since the photoresist 22 is completely removed in the open windows 24', the loading effect of the RIE etch will result in a faster etch rate in larger photoresist window openings than in smaller window openings hence implementing a taper 14 in the carrier supplying layer 16 as depicted by FIGS. 1b and 1c. The mask pattern in this alternative method is similar to a conventional gray scale mask, but rather than relying on the intensity of light for making different openings to create a tapered profile 24 in the photoresist 22, this alternative method relies on the loading effect of the RIE etch process to etch more of the carrier supplying layer 16 in the wider open windows.

Figure 2:
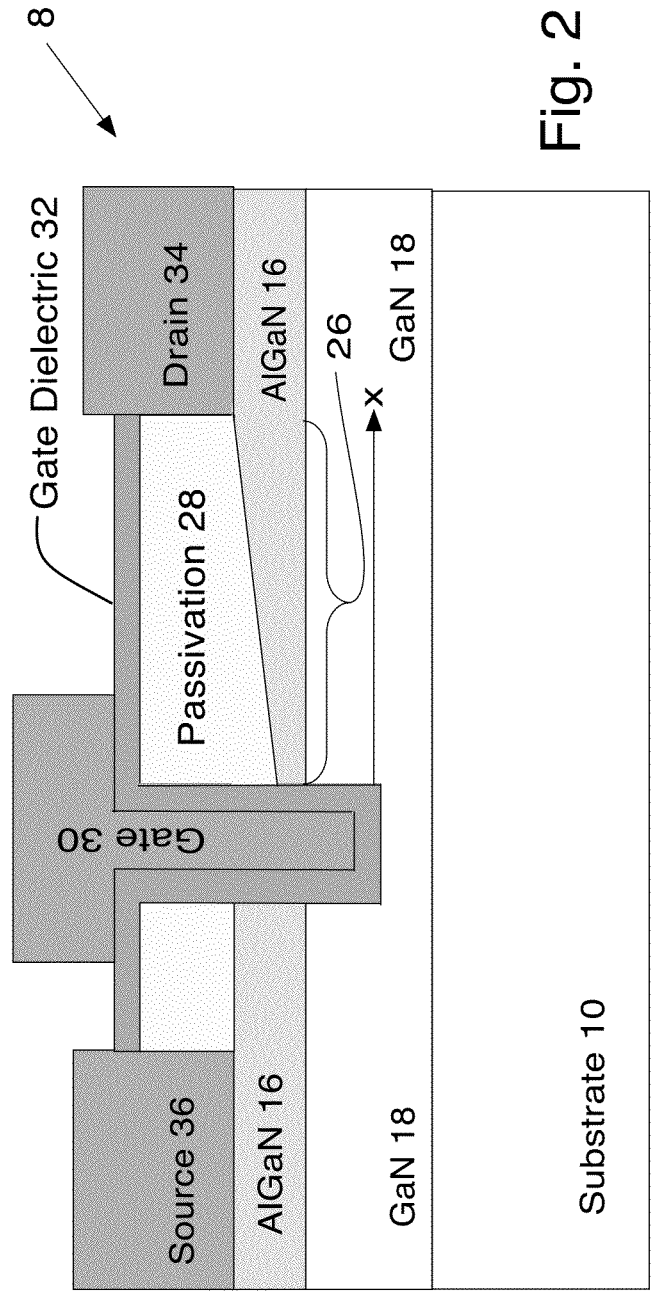
FIG. 2 is a schematic presentation of charge density (depth is not drawn to scale) of the preferred embodiment of a completed HMET device of FIG. 1a after the carrier supplying layer (preferably AlGaN) has been tapered in the region between the gate and the drain.

Irrespective of which method is used to form the taper 14, the taper 14 ends at a step 20 (see FIG. 1b or 1c) back to the normal height of layer 16 near where the gate 30 will be formed. The taper 14 smoothly ends where the carrier supplying layer 16 returns to its otherwise normal height at the other end 38 of the wedge or taper 14 near (and preferably immediately adjacent) where the drain 34 will be formed. The gate 30, drain 34 and a passivation layer 28 with eventually occupy this region as shown in FIG. 2. FIG. 1b illustrates that the taper 14 varies in the x-direction. FIG. 1c illustrates that the taper 14 preferably does not vary in the y-direction.

After the tapering of the AlGaN layer 16 is completed preferably using the techniques discussed above with respect to either FIGS. 1a and 1b or FIG. 3, ohmic contacts 36 and 34 to the source and drain 2DEG regions are formed preferably using a stack of metal lift off followed by an Rapid Thermal Anneal (RTA) treatment. Thereafter a dielectric 28 is deposited at the exposed surfaces for passivation and it is subsequently patterned in the source and drain contact 36 and 34 areas to open the ohmic contacts 36 and 34 followed by the formation of a gate 30 stack. First a gate foot is preferably etched in the passivation dielectric 28 using either a dry etching or wet etching or a combination of dry/wet etching. The techniques disclosed herein are suitable for use with either an enhancement mode HMET device or a depletion mode HMET device. In a preferred embodiment, as in an enhancement mode device, a fluorine treatment or a combination of fluorine treatment and gate recess (with a further dry etch) can be performed to deplete the channel under the gate 30 of its 2DEG. Thereafter a suitable gate dielectric 32 is deposited. In a preferred embodiment the gate dielectric 32 could by of $Al_2O_3$ oxide deposited by atomic layer deposition (ALD), however, gate dielectric materials other than $Al_2O_3$ may be utilized and may be deposited using methods other than ALD including but not limited to PECVD, LPCVD, in-situ grown in MOCVD reactor, etc.

A gate 30 metal stack is then deposited and patterned. Further steps to implement multi-step field plates can then be used where the cumulative effects of field shaping techniques using both non-uniform 2DEG density profile and multi-step field plate techniques can be combined. Additional intermetallic dielectric and metal layers may be used to reduce the interconnect resistance particularly if the resulting HMET is a large power device.

Since the density of charge in the 2DEG region 12 is determined locally by the thickness of the carrier supplying layer 16 at any given position, a non uniform 2DEG distribution is achieved by controlling the height (thickness) of the carrier supplying layer 16 which should increase as a function of distance laterally away from the gate 30 along the drift region toward the drain 34. See FIG. 2 where the right hand side of the gate 30 structure is preferably positioned where the step 20 formerly occurred and the left hand side of the drain 34 is preferably positioned at the other end 38 of the wedge or taper 14. The dependence of the 2DEG density on the thickness of the carrier supplying layer 16 is illustrated in the following paper: Smorchkova, I. P. et al., "Polarization-induced charge and electron mobility in AlGaN/GaN heterostructures grown by plasma-assisted molecular epitaxy," Journal of Applied Physics, Volume 86, Issue 8, pp. 4520-4526, October 1999, and in particular FIG. 5c.

Figure 5:
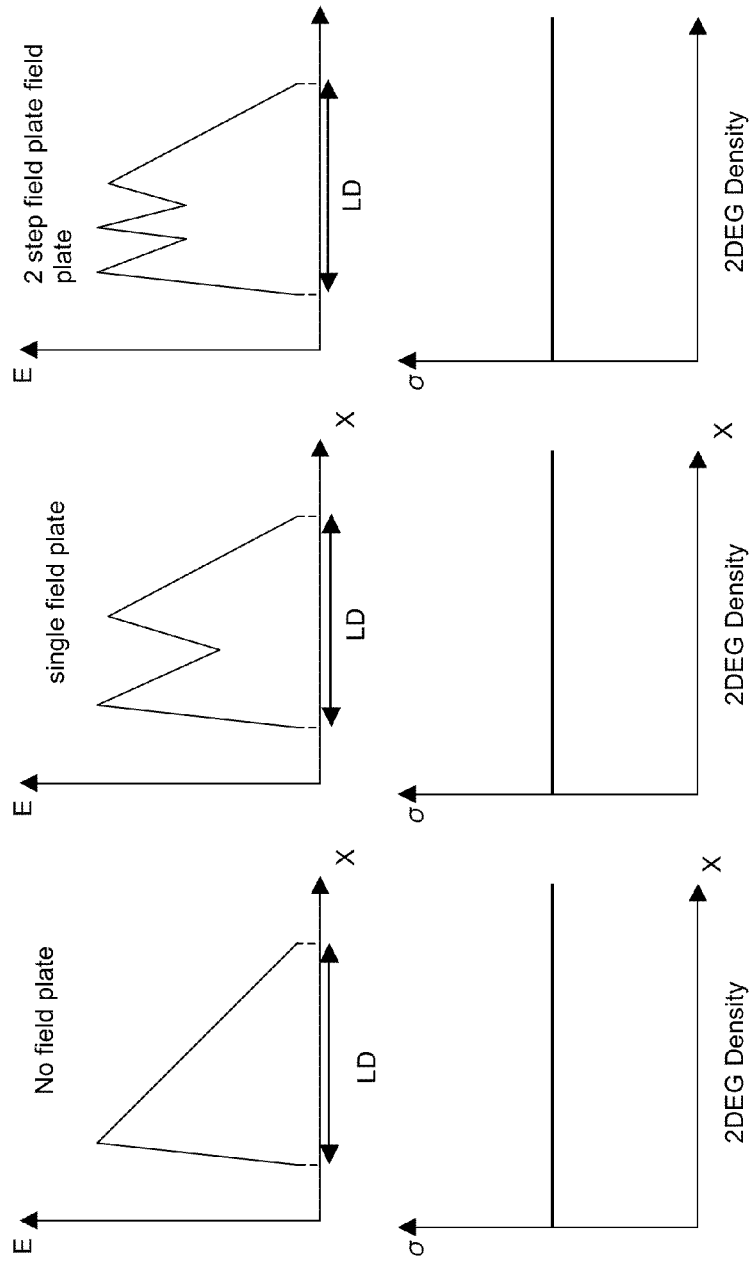
FIG. 5 depicts both the electric field distribution (with a triangular profile) and a flat 2DEG density for prior art HEMT devices having zero, one and two field plates.

From the band energy diagram of FIG. 5, which is from the paper by Smorchkova, I. P. et al identified above, it can be seen that when a thin AlGaN layer is utilized as the carrier supplying layer 16, the Fermi level is above the donor surface states level which results in the donors atoms being filled and not supplying the 2DEG electrons to the well at the GaN/AlGaN interface. As the AlGaN thickness increases the Fermi level moves downwards and eventually overlaps with the donor state energy level resulting in some of the donors are being empty with their originally compensating electrons being transferred to the 2DEG well. The further the overlap is the higher the 2DEG density is.

Figure 4:
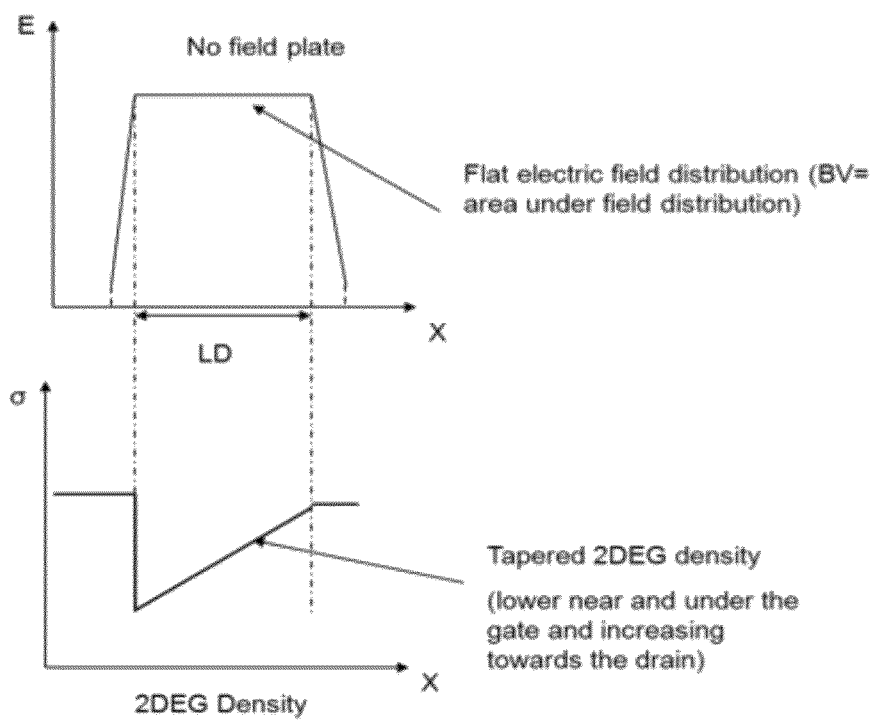
FIG. 4 depicts both the electric field distribution (which is flat) and the tapered 2DEG density for the device of FIG. 2.

A flat electric field distribution is achieved using the non-uniform 2DEG density concept as shown in FIG. 5 of the paper by Smorchkova, I. P. et al identified above which maximizes the lateral breakdown voltage per unit length of the drift region and improves immunity to dynamic $R_{on}$ degradation. In contrast, as shown in FIGS. 5a-5c for various configurations, if a uniform 2DEG density profile is used, then the electric field profile is either triangular (no field plate) or has multiple peaks as shown in FIGS. 5b and 5c (multiple field plates). The uniform 2DEG and zero or more field plates results in a reduced breakdown voltage BV and less immunity to dynamic $R_{on}$ degradation compared tapered 2DEG distribution shown in FIG. 4.

If one adds one or more field plates to the embodiment of FIG. 2 as mentioned above, that will increase the complexity of the process since additional process steps are then required which will increase the cost of making the device. However, adding one or more field plates to the embodiment of FIG. 2 may yield additional performance benefits. Whether the improvement in performance by adding one or more field plates to the embodiment of FIG. 2 is justified by the increase in cost of manufacture is a matter of design choice.

Not shown in the drawings, but as is well known, a spacer layer of AlN, for example, may be inserted between layers 16 and 18 to improve device electrical performance.

This concludes the detailed description including preferred embodiments of the present invention. The foregoing description including preferred embodiments of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concepts as set forth in the following claims.

What is claimed is:

1. A HEMT device comprising:
    a. a substrate;
    b. a buffer layer disposed above said substrate;
    c. a carrier supplying layer disposed above said buffer layer;
    d. a gate element penetrating said carrier supplying layer;
    e. a drain element disposed on said carrier supplying layer;
    f. wherein the carrier supplying layer has a non-uniform thickness between said gate element and said drain element, the carrier supplying layer having a relatively greater thickness adjacent the drain element and a relatively thinner thickness adjacent the gate element.

2. The HEMT device of claim 1 wherein the buffer layer contains GaN and wherein the carrier supplying layer contains AlGaN.

3. The HEMT device of claim 1 wherein the buffer layer and the carrier supplying layer comprise different group III-Nitride compounds.

4. The HEMT device of claim 1 wherein a two-dimensional electron gas conduction channel is formed in said carrier supplying layer, the two-dimensional electron gas conduction channel having a non-uniform profile between said gate and drain elements.

5. The HEMT device of claim 1 wherein said carrier supplying layer smoothly varies in thickness between said gate element and said drain element, the carrier supplying layer having its relatively greater thickness next to the drain element and its relatively thinner thickness next to the gate element.

6. The HEMT device of claim 5 further including a source element disposed on said carrier supplying layer, said carrier supplying layer maintaining an essentially constant thickness between said gate element and said source element.

7. The HEMT device of claim 5 further including a source disposed on said carrier supplying layer, said carrier supplying layer maintaining an essentially constant thickness between said gate element and said source.

8. A HEMT device having a non-uniform two-dimensional electron gas conduction channel formed in a carrier supplying layer of the HEMT device between a gate element of the HEMT device and a drain element of the HEMT device, the HMET device also having a constant electric field distribution between said gate element and said drain element.

9. The HEMT device of claim 8 further including a uniform two-dimensional electron gas conduction channel formed in said carrier supplying layer of the HEMT device between said gate element of the HEMT device and a source element of the HEMT device.

10. A HEMT device comprising:
   a. a substrate;
   b. a buffer layer disposed above said substrate;
   c. a carrier supplying layer disposed above said buffer layer;
   d. a gate;
   e. a drain disposed on said carrier supplying layer;

wherein a two dimensional electron gas (2DEG) is formed between the gate and the drain and wherein the carrier supply layer is configured to adapt the 2DEG such that a variation in electric field strength as a function of a distance between the gate and the drain is substantially constant.

11. The HEMT device of claim 10 wherein the buffer layer contains GaN and wherein the carrier supplying layer contains AlGaN.

12. The HEMT device of claim 10 wherein the buffer layer and the carrier supplying layer comprise different group III-Nitride compounds.

13. The HEMT device of claim 10 wherein a two-dimensional electron gas conduction channel is formed below a heterointerface between the carrier supplying layer and buffer layer, the two-dimensional electron gas conduction channel having a non-uniform profile between said gate and drain.

14. The HEMT device of claim 10 wherein the gate penetrates said carrier supplying layer.

15. The HEMT device of claim 10 wherein said carrier supplying layer smoothly varies in thickness between said gate element and said drain element, the carrier supplying layer having its relatively greater thickness next to the drain element and its relatively thinner thickness next to the gate element.

* * * * *